United States Patent [19]

Walker et al.

[11] Patent Number: 4,922,059
[45] Date of Patent: May 1, 1990

[54] ORIGAMI COMPOSITE EMI/TEMPEST PROOF ELECTRONICS MODULE

[75] Inventors: John S. Walker, Scottsdale; Scott E. Jenkins, Phoenix, both of Ariz.

[73] Assignee: Motorola, Inc., Schaumburg, Ill.

[21] Appl. No.: 290,480

[22] Filed: Dec. 29, 1988

[51] Int. Cl.⁵ ............................................. H05K 1/00
[52] U.S. Cl. ................................ 174/254; 174/35 R; 361/398; 361/424
[58] Field of Search ............... 174/68.5, 254, 35 R; 361/398, 424

[56] References Cited

U.S. PATENT DOCUMENTS

| | | | |
|---|---|---|---|
| 3,816,911 | 6/1974 | Knappenberger | 361/424 X |
| 4,152,671 | 5/1979 | Tuma et al. | 174/35 R X |
| 4,394,707 | 7/1983 | Consoli | 361/398 |
| 4,703,984 | 11/1987 | Mitchell, Jr. | 361/398 X |
| 4,792,879 | 12/1988 | Bauknecht et al. | 361/398 X |

FOREIGN PATENT DOCUMENTS 1519246 3/1968 France ................................ 174/254

*Primary Examiner*—Morris H. Nimmo
*Attorney, Agent, or Firm*—Jordan C. Powell

[57] ABSTRACT

An origami printed circuit board comprises a rigid printed circuit board having a flexible conducting back secured to the bottom of the circuit board. The flexible back is constructed of alternating layers of flexible dielectric and conducting layers bonded together, where the conducting layers may include copper. The circuit board is then grooved in a predetermined manner with the grooves extending through the rigid circuit board, but not extending into the flexible conducting back. The entire circuit board/flexible back is then folded along the grooves in origami fashion to form an enclosure, or other designed shape, with the flexible back forming the outer walls of the shape. By coupling the electronic elements of the circuit board to the conducting layers of the flexible back, the flexible conducting back includes electronic circuit printed interconnections on the rigid board. A bottom conducting layer of the flexible back may be uncoupled to the electronic elements of the circuit board. When the origami printed circuit board is folded into shape, the bottom layer forms the board's outer wall and creates an EMI/TEMPEST shield. The shield also isolates RF frequency emissions.

20 Claims, 3 Drawing Sheets

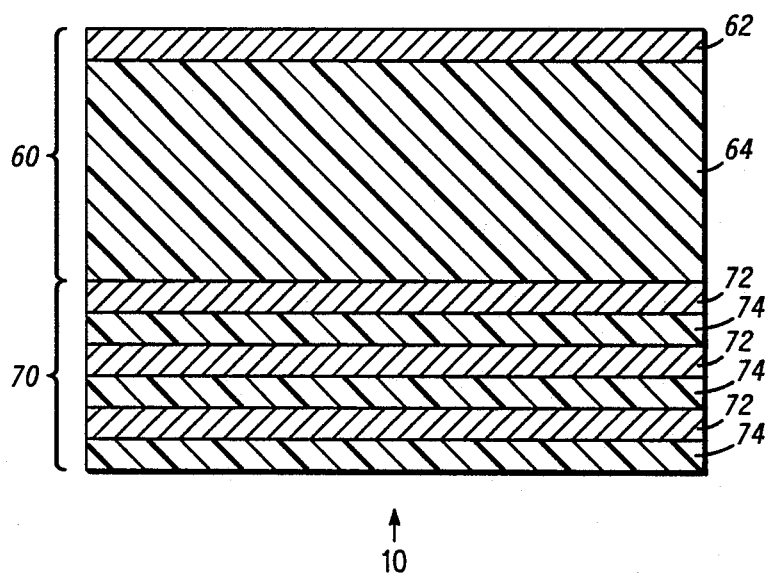
FIG. 3
FIG. 4
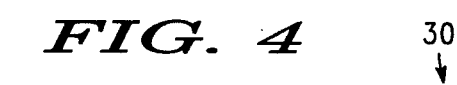

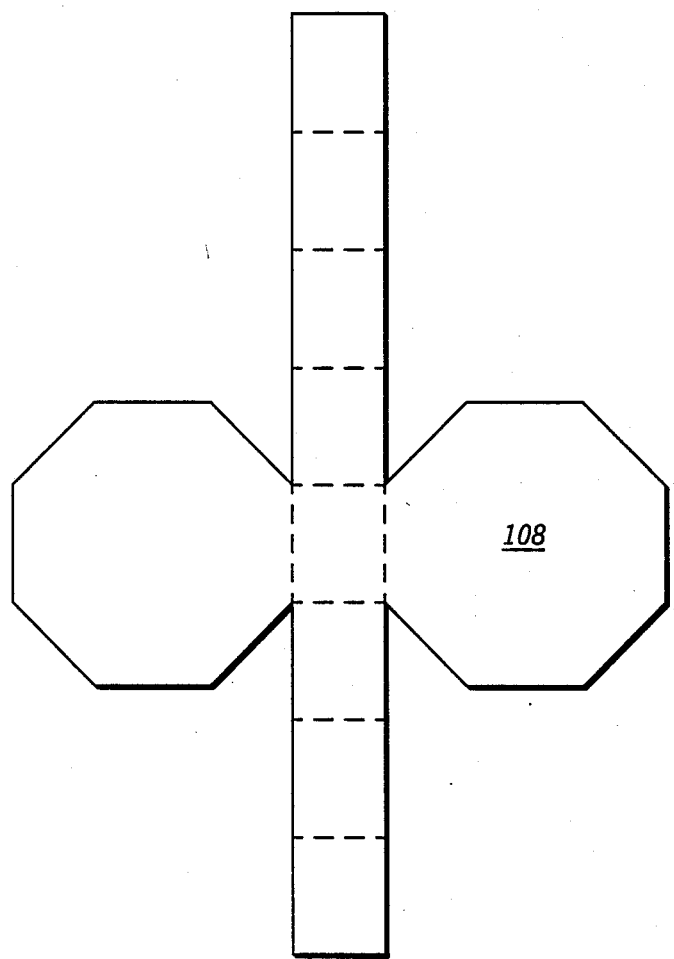
FIG. 5
FIG. 6
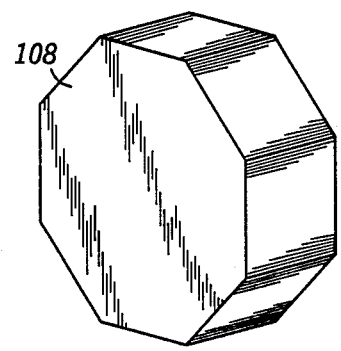

ORIGAMI COMPOSITE EMI/TEMPEST PROOF ELECTRONICS MODULE

This invention was made with Government support under MDA904-87-C-6508 awarded by Maryland Procurement Office (NSA). The Government has certain rights in this invention.

BACKGROUND OF THE INVENTION

This invention relates, in general, to printed circuit boards, and more specifically, to folding EMI (electromagnetic interference)/TEMPEST (descriptive term for electromagnetic energy conducted or radiated from equipment processing classified information) proof printed circuit board modules.

Problems with protecting EMI and TEMPEST emissions from detection outside of the circuit, as well as problems with radio frequencies (RF) penetrating and interupting the circuit, has prompted security housing to surround the printed circuits. The housing can often be comparatively large and requires intermediate or post assembly. For instance, when the housing and circuit board are not integrated, each must be constructed separately with an additional assembly process. Testing after assembly can be very difficult.

SUMMARY OF THE INVENTION

Accordingly, it is an object of the present invention to provide a EMI/TEMPEST proof circuit board which is compact and requires a single assembly process.

Another object of the present invention is to provide an EMI/TEMPEST proof circuit board that integrates a security/tamper housing element with the printed circuit board.

A further object of the present invention is to provide an EMI/TEMPEST proof circuit board which can be easily tested and is assembled by folding the circuit board into a box like shape with structural elements incorporated with the circuit board.

Another object of the present invention is to provide an improved printed circuit board having inexpensive element interconnections in a common medium.

An origami printed circuit board is hereafter described which accomplishes the above objects and advantages. The circuit board generally comprises a rigid printed circuit board having a flexible conducting back secured to the bottom of the circuit board. The flexible back is constructed of alternating layers of flexible dielectric and conducting layers bonded together, where the conducting layers may include copper. The circuit board is then grooved in a predetermined manner with the grooves extending through the rigid circuit board, but not extending into the flexible conducting back. The entire circuit board/flexible back is then folded along the grooves in an origami fashion to form an enclosure, or other designed shape, with the flexible back forming the outer walls of the shape. By coupling the electronic elements of the circuit board to the conducting layers of the flexible back, the flexible conducting back includes electronic circuit printed interconnections on the rigid board. A bottom conducting layer of the flexible back may be uncoupled to the electronic elements of the circuit board. When the origami printed circuit board is folded into shape, the bottom layer forms the board's outer wall and creates an EMI/TEMPEST shield. The shield also prevents RF frequencies from penetrating into or emitting from the circuit board.

The above and other objects, features, and advantages of the present invention will be better understood from the following detailed description taken in conjunction with the accompanying drawings.

BRIEF DESCRIPTION OF THE DRAWING

FIG. 3 is a cut-away side view of the origami printed circuit board;

FIG. 4 is a cut-away side view of the origami printed circuit board across a fold line showing the fold line detail;

FIG. 5 is a top view of an origami printed circuit board according to a second embodiment of the present invention; and FIG. 6 is an isometric view of the second embodiment of the origami printed circuit board in its folded state.

DETAILED DESCRIPTION OF THE INVENTION

Figure 1:
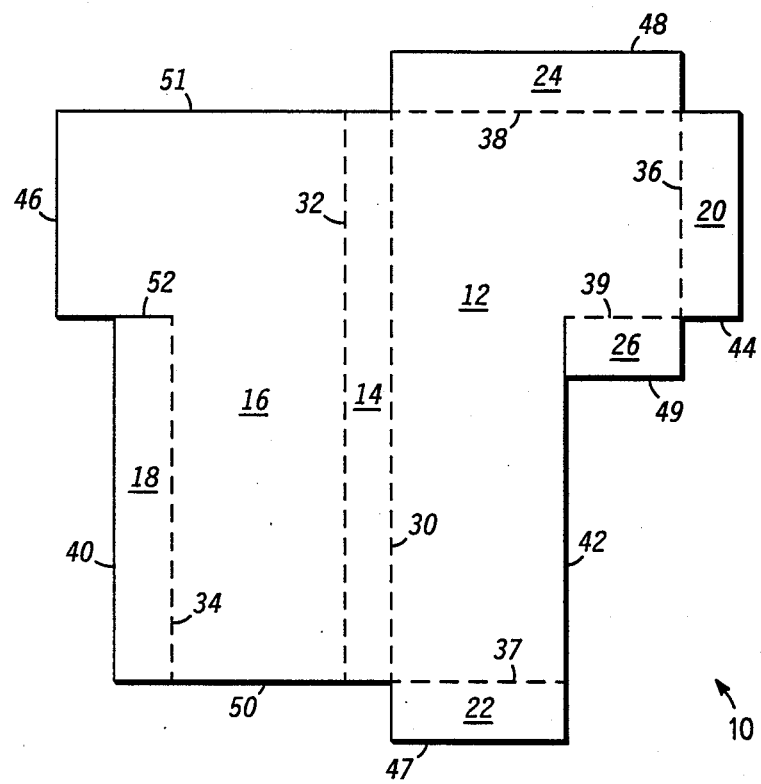
FIG. 1 is a top view of an origami printed circuit board showing fold lines according to one embodiment of the present invention.

FIG. 1 shows a top view of an origami EMI/TEMPEST proof circuit board 10 which can be folded into the shape of an "L" shaped box in its preferred embodiment. In FIG. 1, the dashed lines represent fold lines, whereas solid lines represent cuts through the entire circuit board 10.

Circuit board 10 comprises base board 12, side board 14, top board 16, side flaps 18 and 20, and end flaps 22, 24, and 26. It should be recognized that the specific names given to the components do not suggest any specific orientation of circuit board 10, but are given to the various elements of circuit board 10 only for reference purposes in describing a preferred embodiment of the present invention.

In assembling circuit board 10, side board 14 is folded along fold line 30 into a perpendicular position with respect to base board 12. Top board 16 is then folded along fold line 32 into a horizontal position directly above base board 12 and perpendicular to side board 14.

Side flap 18 is folded into a vertical position along fold line 34 such that edge 40 of side flap 18 contacts edge 42 of base board 12. Similarly, sideflap 20 is folded along fold line 36 to connect edge 46 of side flap 20 with edge 46 of top board 16. End flaps 22, 24, and 26 are folded along fold lines 37, 38, and 39 respectively to connect edges 47, 48, and 49 with edges 50, 51, and 52 respectively.

Figure 2:
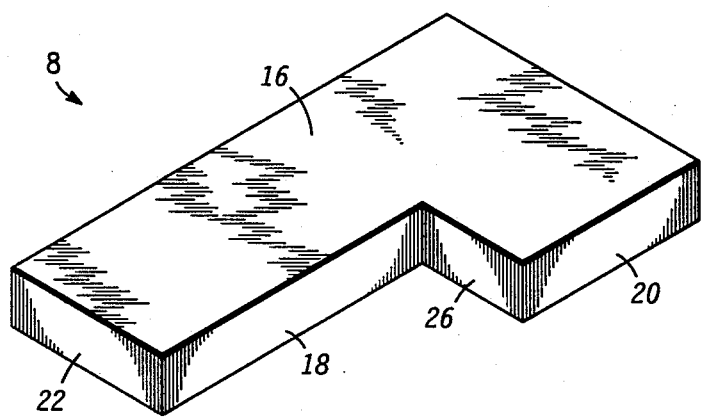
FIG. 2 is an isometric view of the origami printed circuit board in its folded state.

The isometric view of FIG. 2 shows circuit board 10 folded into electronics module 8. Edges 40 through 52 are all bevelled at predetermined angles to ensure proper filling of the connecting edges, and to supply structural support to electronics module 8. In the preferred embodiment of FIG. 2, edges 40 through 52 are bevelled at a 45 degree angle.

It should be noted that the term connected does not necessarilly connote that the edges are secured to each other. In practice, electronic module 8 could be held in its folded condition by a housing into which electronic module 8 may be inserted.

FIG. 3 shows a portion of a cross-section of circuit board 10. In the cross-sectional view, circuit board 10 comprises generally printed board 60 and flexible conducting board 70. Printed circuit board 60 comprises an upper layer of printed conducting material 62 and dielectric rigid layer 64. It should be noted that printed circuit board 60 may be comprised of alternating layers of printed conducting material 62 and dielectric rigid layer 64. Upper layer 62 in FIG. 3 represents the printed circuit of electronics module 8.

Flexible conducting board 70 comprises a plurality of conducting layers 72 and plurality of flexible dielectric layers 74. The number of conducting layers 72 will vary depending upon the design of the printed circuit design of upper layer 62. Conducting layers 72 are prefereably comprised of approximately 2 ounces of copper per square inch for a thickness of approximately 2.8 mills. Flexible dielectric layers 74 are comprised generally of polyimide and are approximately 2 to 7 mills thick.

FIG. 4 shows a detail of fold line 30, and represents the detail of all fold lines 30 through 39. Fold line 30 comprises V cut 80 with sides 82 and 84 forming 45 degree angles with horizontal in the preferred embodiment of FIG. 4. V cut 80 extends through printed board 60, but does not extend into flexible conducting board 70. When circuit board 10 is folded to form electronics module 8, sides 82 and 84 are brought together to form a 90 degree angle between base board f12 and side board 14. By resting sides 82 and 84 against each other, electronic module 8 becomes self-supporting. Although the embodiment of FIG. 4 shows V cut 80 with 45 degree angles to form 90 degree angles between base board 12 and side board 14 when folded, other angles are contemplated, and required, when electronic module 8 is folded into other designs in origami fashion.

As sides 82 and 84 are folded together, both tension and compression forces are created within flexible conducting board 70. A neutral axis 90 forms a line where one side of neutral axis 90 experiences tensile forces while the opposite side experiences compression forces. Specifically, that portion of flexible conducting board 70 which is between neutral axis 90 and printed board 60 experiences compressive forces, while that portion of flexible conducting board 70 on the opposite side of neutral axis 90 experiences tensile forces. Such compressive and tensile forces are capable of impacting the conducting ability of conducting layers 72. Since the tensive and compressive forces increase proportional to the distance to neutral axis 90, conducting layers 72 are placed as close to neutral axis 90 as is feasible while still layering each of the conducting layers 72 between flexible dielectric layers 74. This reduces the effect the tensile/compressive forces have on conducting layers 72.

Conducting layers 72 are designed to act as interconnects for the printed circuit of upper layer 62. By interconnecting elements/components of the printed circuit of upper layer 62 with conducting layers 72, the entire area of upper layer 62 covering circuit board 10, including side flaps 18 and 20, and end flaps 22 through 26, may incorporate elements/components of the printed circuit.

When circuit board 10 is folded into electronics module 8, all elements/components of the printed circuit are enclosed within electronics module 8. The external walls of electronics module 8 are the bottom layers of flexible dielectric layer 74 and conducting layers 72. The bottom conducting layer 72 is coupled to a ground circuit of upper layer 62 to operate as a ground shield isolating the internal circuit from EMI and TEMPEST sensing.

Electronics module 8 can be constructed without a ground shield isolating the internal circuit from EMI/-TEMPEST sensing and from RF interference. Where such a shield is not needed, all conducting layers 72 operate as flexible interconnections between the elements of the printed circuit of upper layer 62. Furthermore, non-secure elements/components may be coupled on the outer walls of flexible conducting board 70.

It will be recognized that electronics module 8 can be constructed in various shapes with the box shape of FIG. 4 as one example or embodiment of the EMI/-TEMPEST proof electronics module. Any shape creating an enclosure from folding a single flat unit into the shape in origami style is contemplated within the present invention. In such forms, bevelled fold lines 30 through 39, and bevelled edges 40 through 52 may be oriented at angles other than 45 degrees. For instance, FIGS. 5 and 6 show an octagonal shaped electronic module 108 in its printed board state in FIG. 5, and in its folded state as shown in FIG. 6. FIGS. 5 and 6 are shown only to illustrate that the electonic module may be constructed in any shape using orgami designs.

Thus there has been provided, in accordance with the present invention, a tempest/tamper proof electronics module that fully satisfies the objects, aims, and advantages set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

I claim:

1. An electronics module comprising:
   circuit board means:
   at least one dielectric layer means for supplying flexible support to said circuit board means;
   at least one conducting layer means for supplying a signal connection for said circuit board means;
   said at least one dielectric layer means and said at least one conducting layer means bonded in an alternating layered fashion:
   said bonded at least one dielectric layer means and said at least one conducting layer means (bonded DLM/CLM) coupled to a bottom portion of said circuit board means;
   groove means for supplying a plurality of folds within said circuit board means:
   said groove means secured in a predetermined pattern on and upper portion of said circuit board means: and
   said circuit board means and said bonded DLM/CLM folded along said groove means to form an enclosure.

2. An electronics module according to claim 1 werein said flex means forms a neutral tension/compression axis, said axis generally following a longitudinal central line along said folded bonded DLM/CLM.

3. An electronics module according to claim 2 wherein said at least one conducting layer means is situated in close proximity to said longitudinal central line.

4. An electronics module according to claim 1 wherein said groove means comprises a plurality of "V" grooves.

5. An electronics module according to claim 1 wherein said groove means comprises a plurality of "V" grooves extending through said circuit board.

6. An electronics module according to claim 5 wherein said groove means further comprises a plurality of "V" grooves, each side of said "V" angled at approximately a 45° angle from said horizontal base of said circuit board means.

7. An electronics module comprising:
circuit board means:
at least one dielectric layer means for supplying flexible support to said circuit board means;
at least one conducting layer means for supplying a signal connection for said circuit board means;
said at least one dielectric layer means and said at least one conducting layer means bonded in an alternating layered fashion;
said bonded at least one dielectric layer means and said at least one conducting layer means (bonded DLM/CLM) coupled to a bottom portion of said circuit board means;
groove means for supplying a plurality of folds within said circuit board means;
said groove means secured in a predetermined pattern on an upper portion of said circuit board means;
said circuit board means and said bonded DLM/CLM folded along said groove means to form an enclosure;
shield means suecured to a bottom portion of said bonded DLM/CLM; and
said shield means for shielding the electronics module from radio frequencies and from EMI/TEMPEST probes.

8. An electronics module according to claim 7 wherein said bonded DLM/CLM forms a neutral tension/compression axis, said axis generally following a longitudinal central line along said folded bonded DLM/CLM.

9. An electronics module according to claim 8 wherein said at least one conducting layer means is situated in close proximity to said longitudinal central line.

10. An electronics module according to claim 7 wherein said groove means comprises a plurality of "V" grooves.

11. An electronics module according to claim 7 wherein said groove means comprises a plurality of "V" grooves extending through said circuit board.

12. An origami electronics module comprising:
circuit board;
flex means securely coupled to a bottom portion of said circuit board;
said flex means for supplying a flexible signal connection for said circuit board;
said flex means comprising:
at least one dielectirc layer means for supplying flexible support to said flex means;
at least one conducting layer means for supplying said signal connection for said circuit board;
said at least one dielectric layer means and said at least one conducting layer means bonded in an alternating layered fashion;
groove means for supplying a plurality of folds within said circuit board;
said groove means secured in a predetermined pattern on an upper portion of said circuit board; and
said circuit board and said flex means folded along said groove means to form an enclosure.

13. An electronics module according to claim 12 wherein said flex means forms a neutral tension/compression axis, said axis generally following a longitudinal central line along said folded flex means.

14. An electronics module according to claim 13 wherein said at least one conducting layer means is situated in close proximity to said longitudinal central line.

15. An electronics module according to claim 12 wherein said groove means comprises a plurality of "V" grooves.

16. An electronics module according to claim 12 wherein the electronics module further comprises:
shield means for shielding the electronics module from radio frequencies and from EMI/TEMPEST probes; and
said shield means secured to a bottom portion of said flex means.

17. An EMI/TEMPEST sensing proof electronics module comprising:
circuit board;
flex means securely coupled to a bottom portion of said circuit board;
said flex means for supplying a flexible signal connection for said circuit board;
said flex means comprising:
at least one dielectric layer means for supplying flexible support to said flex means;
at least one conducting layer means for supplying said signal connection for said circuit board;
said at least one dielectric layer means and said at least one conducting layer means bonded in an alternating layered fashion;
shield means for shielding the electronics module from radio frequencies and from EMI/TEMPEST probes;
said shield means secured to a bottom portion of said flex means;
groove means for supplying a plurality of folds within said circuit board;
said groove means secured in a predetermined pattern on an upper portion of said circuit board; and
said circuit board and said flex means folded along said groove means to form an enclosure.

18. An electronics module according to claim 17 wherein said flex means forms a neutral tension/compression axis, said axis generally following a longitudinal central line along said folded flex means.

19. An electronics module according to claim 18 wherein said at least one conducting layer means is situated in close proximity to said longitudinal central line.

20. An electronics module according to claim 17 wherein said groove means comprises a plurality of "V" grooves.

* * * * *

UNITED STATES PATENT AND TRADEMARK OFFICE
CERTIFICATE OF CORRECTION

PATENT NO. : 4,922,059

DATED : May 1, 1990

INVENTOR(S) : John S. Walker et al.

It is certified that error appears in the above-identified patent and that said Letters Patent is hereby corrected as shown below:

In column 4, claim 1, line 51, delete the word "and" and substitute --an--.

In column 4, claim 2, line 56, delete the word "werein" and substitute --wherein--.

In column 4, claim 2, line 57, delete the words "flex means" and substitute --bonded DLM/CLM--.

In column 5, claim 7, line 29, delete the word "suecured" and substitute --secured--.

Signed and Sealed this

Ninth Day of July, 1991

Attest:

HARRY F. MANBECK, JR.

Attesting Officer

Commissioner of Patents and Trademarks